United States Patent
Schenkel et al.

(10) Patent No.: US 7,474,976 B2
(45) Date of Patent: Jan. 6, 2009

(54) DEVICE AND METHOD FOR COMPENSATION OF MAGNETIC FIELD DISRUPTIONS IN HIGHLY HOMOGENEOUS MAGNETIC FIELDS

(75) Inventors: Michael Schenkel, Baeretswil (CH); Rolf Hensel, Zurich (CH); Werner Tschopp, Forch (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/878,178

(22) Filed: Jul. 23, 2007

(65) Prior Publication Data

US 2008/0027666 A1    Jan. 31, 2008

(30) Foreign Application Priority Data

Jul. 31, 2006   (DE)   ......................  10 2006 035 949

(51) Int. Cl.
    *G06F 19/00*    (2006.01)
(52) U.S. Cl. .................. 702/85; 702/106; 324/307; 324/309; 324/317; 324/318; 324/322
(58) Field of Classification Search .................. 702/85, 702/106; 324/307, 309, 318, 317, 322
    See application file for complete search history.

(56) References Cited

U.S. PATENT DOCUMENTS

| | | |
|---|---|---|
| 4,535,595 A | 8/1985 | Keller |
| 4,788,502 A | 11/1988 | Keller |
| 5,191,287 A | 3/1993 | Marek |
| 5,245,286 A * | 9/1993 | Carlson et al. .............. 324/319 |
| 5,302,899 A | 4/1994 | Schett |
| 5,731,704 A | 3/1998 | Schnur |
| 2003/0214296 A1 | 11/2003 | Carlini |

* cited by examiner

*Primary Examiner*—Tung S Lau
*Assistant Examiner*—Hien X Vo
(74) *Attorney, Agent, or Firm*—Paul Vincent

(57) ABSTRACT

A device for compensating field disruptions in magnetic fields of electromagnets with high field homogeneity, in particular, for stabilizing the H0 field of an MR measuring system, comprising at least one field detector (31) for detecting interfering signals ($U_{in}$), at least one control loop for processing the detected interfering signals ($U_{in}$), and at least one compensation coil (34) to which the detected and processed interfering output signals ($U_{out}$) are transferred and which generates a correction field for compensating the interfering signals ($U_{in}$), is characterized in that at least one of the control loops comprises a multi-selective filter system (35) which comprises one or more parallel connected selective filter elements whose center frequencies can be tuned either once or in an adaptive fashion to the frequency values of the interfering signals ($U_{in}$) to be compensated for, wherein the outputs of these filter elements are connected to at least one of the compensation coils (34). The inventive device permits selective detection of periodic field disturbances with high frequency components while a major part of the existing noise is faded out, thereby increasing the SINO.

19 Claims, 5 Drawing Sheets

DEVICE AND METHOD FOR COMPENSATION OF MAGNETIC FIELD DISRUPTIONS IN HIGHLY HOMOGENEOUS MAGNETIC FIELDS

This application claims Paris Convention priority of DE 10 2006 035 949.6 filed Jul. 31, 2006 the complete disclosure of which is hereby incorporated by reference.

BACKGROUND OF THE INVENTION

The invention concerns a device for compensation of field disruptions in magnetic fields of electromagnets with high field homogeneity, in particular, for stabilizing the H0 field of an MR measuring system, comprising at least one field detector for detecting interfering signals, at least one control loop for processing the detected interfering signals, and at least one compensation coil to which the detected and processed output interfering signals are transferred and which generates a correction field for interfering signal compensation.

A device of this type is disclosed e.g. in U.S. Pat. No. 5,302,899 A1, which is used, in particular, in nuclear magnetic resonance (NMR) spectrometers.

Field disruptions produced by additional devices on the spectrometer, by systems and machines associated with building installation (elevators, compressors etc.) or external disturbance sources (streetcars etc.) become an increasing problem in magnet configurations of this type due to the high sensitivity and resolution of the devices.

A field change $(\Delta B)_Z$ parallel to the static magnetic field $B_0$ of the NMR magnet and in the area of the NMR test substance generates a change $\Delta\omega$ in resonance frequency of the magnetic nuclear spins within the test substance, which is proportional thereto, and thereby influences the NMR spectrum. This can be seen from the conventional NMR equation $\Delta\omega=\gamma(\Delta B)_Z$. Due to the high spectral resolution and the high sensitivity of modern NMR spectrometers, even minimum disruptive fields of less than $1 \cdot 10^{-9}$ Tesla disturb the NMR spectrum.

It has not been possible up to now to compensate for all relevant field disruptions due to the enormous progress gained in increasing the NMR sensitivity using higher magnetic field strength, the improvement of the field homogeneity within larger measuring ranges, and use of cryogenically cooled measuring probes (cryoprobes) whose sensitivity has increased by factors.

One of these cases which have not been solved up to now concerns the use of refrigerators for cooling superconducting NMR magnets. The unavoidable low-frequency vibrations of such systems produce magnetic field modulations which manifest themselves in the spectrum in the form of sidebands of strong NMR lines. These sidebands are often in the most sensitive area of the NMR spectrum (in the center, in the area of the water line, etc.) and therefore highly disturb the user.

U.S. Pat. No. 4,788,502 describes a superconducting magnet in a cryostat on which a refrigerator is mounted for cooling the cryogenic liquids. The interfering signal from the refrigerator is detected by induction coils or acceleration sensors using a sensor means which is mounted to the refrigerator, and is supplied to the compensation coils via a control device. The compensation coils are preferably mounted to the refrigerator and/or in the room temperature bore (RT bore) of the magnet. The control device contains a coupling matrix with adjustable amplifiers (for "weighting") and a performance chart. However, experience has shown that measurement at the disturbance source gives only insufficient information about the magnetic field disruptions in the sample volume.

U.S. Pat. No. 5,191,287 A1 illustrates generation of periodic field disruptions in the magnetic spins of the test sample with a test sample that rotates in the inhomogeneous $B_0$ field, thereby producing disturbing sidebands in the NMR signal. These are, however, not compensated for immediately but later on in the NMR receiver where the NMR signal undergoes a second manually tuneable amplitude and phase modulation which generates additional sidebands to compensate for the existing disturbing sidebands. The auxiliary frequencies required for modulation are generated by frequency generators which are synchronized with the rotating test sample. This is a compensation and not a control process, since there is no control loop. A posteriori compensation is not possible or would require great effort, since the person performing spectroscopy can program the course of an NMR measurement largely freely.

Another case concerns disturbances that are produced by use of NMR systems in surroundings which are not optimal, since the number of customers who are prepared to pay for expensive and complex infrastructures (buildings, rooms, etc.) decreases. Floor vibrations are an example therefor, which are produced by systems located in the same building.

U.S. Pat. No. 4,788,502 A1 proposes detecting disruptive fields from remote sources (e.g. trolley cars) via induction coils, and transfers them in an opposite direction to the compensation coils via a control amplifier, to counter-couple the disruptive fields. The induction and compensation coils are primarily located outside of the NMR magnet system and surround it. This method, however, is ruled out when the disturbances are coupled into the magnet system through mechanical vibrations.

U.S. Pat. No. 5,302,899 A1 discloses a method for compensating time-variant field disruptions in NMR, wherein the NMR dispersion signal $u_X$ and the NMR absorption signal $u_Y$ of an NMR reference substance (lock substance) are acquired using a digital NMR field stabilizer (digital lock), from which a correction current is derived which is guided into a field correction coil and compensates for the time-variant field disturbances. A combination of the values $u_X/u_Y$ and $1/u_Y \cdot (du_X/dt)$ is thereby supplied to a controller with amplifier with single and/or double integration. This substantially produces a PID controller of the measured value $u_X/u_Y$ which provides sufficient compensation of the field disruptions when the controller parameters are adequately adjusted. Satisfactory adjustment of the controller parameters is, however, often not possible in case of disturbances with higher frequency components. When amplification of the controller is small, the generated noise portion is also smaller but at the same time, the control bandwidth also becomes smaller, and the disturbance suppression of the higher frequency components becomes insufficient. Conversely, an increase in amplification increases the control bandwidth, such that an improvement of disturbance suppression could be expected, but at the same time, the noise portion also increases, so that no satisfactory result can be obtained.

It is therefore the underlying purpose of the present invention to propose a device and a method for compensating disruptive fields, which in addition to a high signal/noise ratio (SINO), also ensures improvement of the compensation of periodic field disturbances, in particular, with higher frequency components.

SUMMARY OF THE INVENTION

This object is achieved in accordance with the invention, in that at least one of the control loops comprises a multi-selective filter system (MSF) which has one or more parallel connected selective filter elements whose center frequencies can be tuned either once or in an adaptive fashion to the frequency values of the interfering signals to be compensated, wherein the outputs of these filter elements are connected to at least one of the compensation coils.

In accordance with the inventive device, the output signals of the MSF filter elements, which are supplied to the compensation coil to generate a magnetic field opposite to the disturbance, can be amplified either individually or after addition thereof, thereby observing the stability criteria of control loops, and phases may also be corrected. The inventive device thereby acts as a field stabilizer which can selectively detect periodic field disruptions with higher frequency components within e.g. an MR apparatus, such that only a fraction of the existing noise is detected. This improves the SINO such that, in particular, suppression of periodic interfering signals with high frequencies can be improved.

The inventive device may comprise several control loops, at least one of which contains an MSF, wherein the center frequencies of the MSFs are tuned to the frequency values of the interfering signals to be compensated for either once or in an adaptive fashion. A conventional control loop moreover advantageously has a control amplifier that obtains, in addition to the inventive selective compensation, a broadband field disruption compensation, in particular, in the low frequency range.

When several MSFs are used, they are disposed in different control loops of the inventive device. It is thereby possible to supply either all MSFs with signals from one single field detector or provide separate field detectors for at least part of the various MSFs and correspondingly also provide separate compensation coils, such that the MSFs are integrated in independent systems.

RF resonators including measuring samples, induction coils or Hall probes may e.g. be used as field detectors.

An adding device is preferably provided to add the interfering output signals of the filter elements.

In an advantageous embodiment of the inventive device, at least one of the multi-selective filter elements is a band pass filter of second order with the complex transfer function $U_{BP}(j\omega)$, wherein:

$U_{BP}(j\omega)=1/(1+j\cdot Q\cdot \Omega)$, with $j=\sqrt{-1}$
$Q\approx \omega_0/B$
$\omega_0$=center frequency of the band pass filter
B=−3 db bandwidth of the band pass filter
$\Omega=(\omega/\omega_0)-(\omega_0/\omega)$
$\Omega\approx 2\cdot(\omega-\omega_0)/\omega_0$ when $(\omega-\omega_0)/\omega_0 \ll 1$
$\omega$=frequency value on the frequency axis In a further development of this embodiment, the selective filter element has a controller for controlling the center frequency of the band pass filter to the frequency of one of the interfering signals, wherein the controller comprises a frequency generator with adjustable frequency, a phase detector for detecting the output signal of the frequency generator and the output signal from the band pass filter, an amplifier and a low pass filter connected downstream of the amplifier, wherein the resulting detection signal is supplied from the phase detector via the amplifier and low pass filter to a register, whose numerical value defines the frequency of the frequency generator and represents the output value of the controller.

In an alternative embodiment, at least one of the multi-selective filter elements comprises a quadrature detector into which the interfering signal and two reference signals are fed via two signal channels, wherein the frequency of the reference signals is approximately equal to the frequency of the interfering signal, wherein the phases of the reference signals are shifted relative to each other by 90°. A transfer unit is moreover provided that is guided to a quadrature modulator with an adding device in which the interfering signals which are guided in the signal channels to the quadrature modulator via the transfer unit are added, wherein the reference signals in the quadrature modulator are identical with the reference signals in the quadrature detector. Due to the 90° shift of the phases of the references signals relative to each other, one interfering signal appears in each of the two signal channels at the output of the quadrature detector at a much lower frequency and with a phase which is shifted by 90° relative to each other. After passing the transfer unit, the two interfering signals are added in the quadrature modulator to form an interfering output signal. After this addition, the interfering output signal has its original frequency but, in contrast to the original interfering signal, this interfering output signal is filtered, wherein this filtering corresponds to the filtering process of a band pass filter whose bandwidth is twice the cut-off frequency of the low pass filter in the transfer unit.

The transfer unit preferably has one amplifier and one low pass filter for each signal channel.

The low pass filter thereby preferably has a complex transfer function $U_{TP}(j\omega)$ which is defined as follows:

$U_{TP}(j\omega)=1/[1+j(\omega/\omega_C)]$, wherein $j=\sqrt{-1}$
$\omega$=frequency value on the frequency axis
$\omega_C$=cut-off frequency of the low pass filter This low pass filter of first order will never produce a phase shift of more than 90°.

Alternatively, the transfer unit for each signal channel (A,B) may comprise one amplifier and one integrator. Amplification of an integrator for a frequency of zero approaches an infinite value. For this reason, interfering signals with frequencies identical to the reference signal are compensated for without residual errors.

In a particularly preferred embodiment of the inventive device, a controller is provided at the output of the quadrature detector via which one of the two interfering signals of one of the two signal channels, transformed by the quadrature detector, can be detected and supplied to a reference generator, wherein the controller preferably comprises an amplifier and a low pass filter.

In particular, when the amplifying values are large, a phase shifter is advantageously provided at the input of the quadrature modulator, which displaces the mutually orthogonal signals in the two signal channels by a defined angle $\Delta\phi$, such that the interfering output signal of the selective filter element is displaced, in addition to the phase response of the transfer unit, by the constant angle $\Delta\phi$ with respect to the interfering signal. Undesired oscillations can thereby be prevented.

In an advantageous further development of this embodiment, a sample and hold device is connected upstream or downstream of the phase shifter, which is operated synchronously with the reference generator. The upper sideband which is also produced in the quadrature detector and is not completely suppressed by the low pass filter is thereby folded on the lower sideband where it no longer interferes.

With particular advantage, one control input is provided in at least one of the selective filter elements, via which the Q factor of the selective filter element can be temporarily switched to very high values. In this fashion, the band pass filter becomes insensitive to the input signal. An increase of the Q factor of the selective filter element is e.g. useful when the sample tube of an NMR spectrometer is changed and the signal $U_{in}$ is therefore subject to great fluctuations.

The invention can be utilized with particular advantage in highly sensitive magnet configurations. The inventive device is therefore preferably part of an NMR or MRI apparatus, in particular, when refrigerators are used to cool the superconducting magnets, since these cause periodic disturbances in the volume under investigation, which are effectively compensated for by the inventive device.

The invention also concerns a method for compensating field disturbances in magnetic fields of electromagnets with high field homogeneity, in particular, for stabilizing the H0 field of an NMR/MRI measuring system, wherein interfering signals are detected by a field detector and transferred via a control branch to a compensation coil, which generates a correction field for field disruption compensation. In the inventive method, the interfering signals are guided through parallel-connected selective filter elements of a multi-selective filter system, wherein the center frequencies of the selective filter elements are tuned once or in an adaptive fashion to the frequency values of the interfering signals to be compensated for. In accordance with the inventive method, the output signals of these filter elements are either amplified individually or after their addition and before their transfer to the compensation coil, thereby accomplishing the stability criteria of control loops, and, if required, undergoing a phase-correction.

In an advantageous variant of the inventive method, a controller tracks the center frequency of a selective filter element, which is designed as a band pass filter, to the frequency of the interfering signal, wherein the output signal of a frequency generator with adjustable frequency, and the interfering output signal from the band pass filter are detected in a phase detector, and the resulting detection signal is subsequently guided via an amplifier and a low pass filter to a register whose numerical value defines the frequency of the frequency generator, wherein this numerical value is used to adjust the center frequency of the band pass filter to the frequency of the interfering signal. The selective filter element may thereby be a directly calculated band pass filter of second order.

An alternative variant consists of a filter element, where the interfering signal and two reference signals of a reference generator are fed into a quadrature detector, wherein the frequency of these reference signals approximately equals the frequency of the interfering signal and their phases are shifted relative to each other by 90°, thereby generating in each signal channel at the output of the quadrature detector one interfering signal at a much lower frequency, wherein these two interfering signals are phase-shifted with respect to each other by 90° and each interfering signal is guided via an amplifier and a low pass filter to a quadrature modulator whose reference signals are identical to those of the quadrature detector. After adding the two interfering signals in the quadrature modulator, an interfering output signal is obtained having the original frequency of the interfering signal, wherein, however the interfering output signal is filtered, in contrast to the original interfering signal.

In a further development of this variant, one of the two interfering signals in the signal channels is detected, preferably at the output of the quadrature detector, and transferred to the reference generator via a controller, wherein the frequency of the reference generator is adjusted with maximum precision to the frequency of the interfering signal (adaptive process). In this fashion, one can immediately and effectively react to frequency changes of the interfering signals.

The two orthogonal signals in the signal channels are preferably shifted by a defined angle $\Delta\phi$ using a phase shifter at the input of the quadrature modulator.

It is thereby advantageous to insert a sample and hold device upstream or downstream of the phase shifter, which is operated synchronously to the reference generator.

Moreover, it may also be advantageous to switch the quality factor of the selective filter elements temporarily to very high values via a control input ("Hold").

Further advantages of the invention can be extracted from the description and the drawing. The features mentioned above and below may be used individually or collectively in arbitrary combination. The embodiments shown and described are not to be understood as a final enumeration but have exemplary character for describing the invention.

DESCRIPTION OF THE PREFERRED EMBODIMENT

Figure 1:
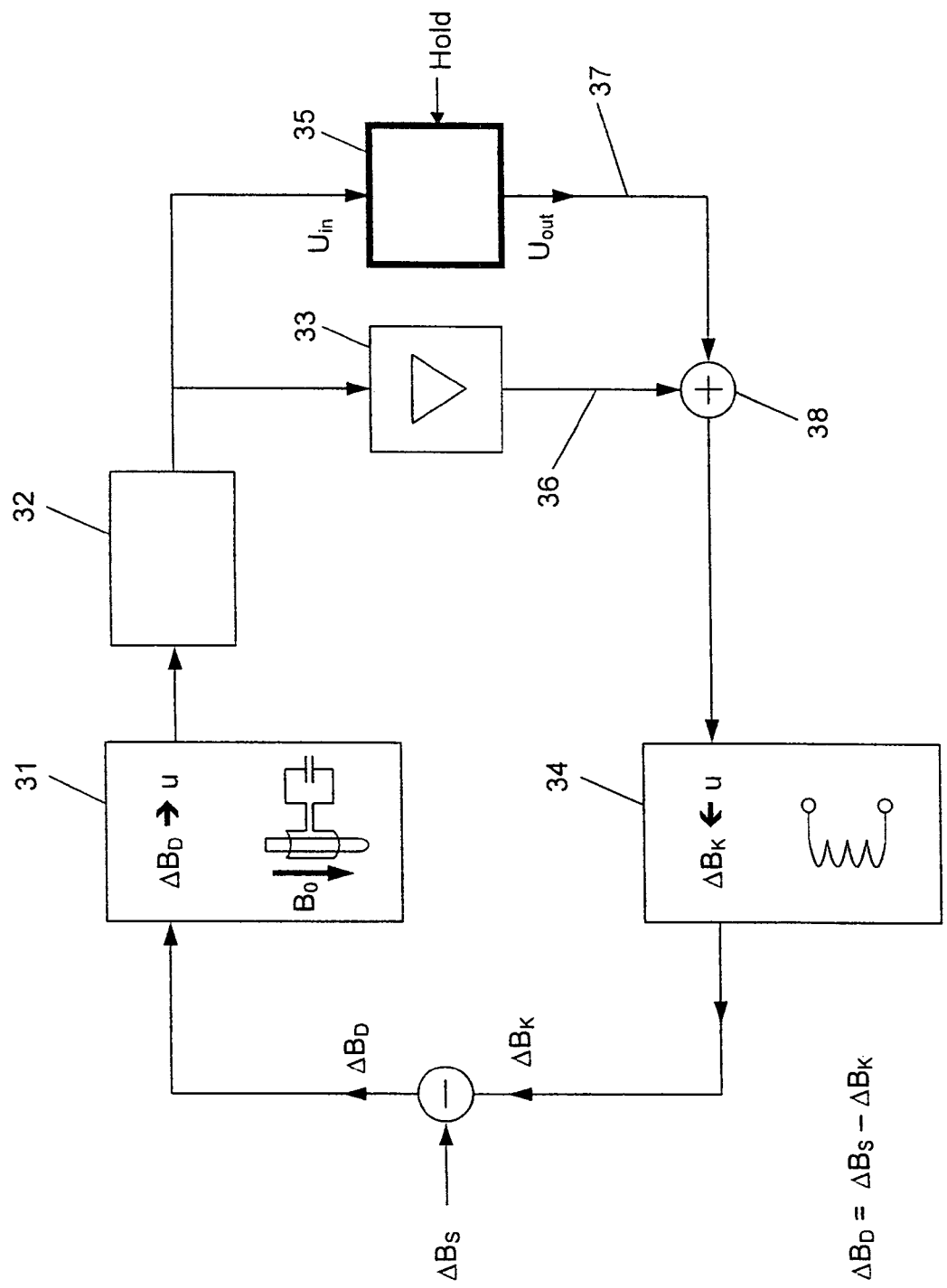
FIG. 1 shows a block diagram of an inventive device comprising two control loops.

FIG. 1 shows a device (field stabilizer) for compensating field disruptions in magnetic fields, e.g. for use in an MR apparatus. A field detector 31 is provided to detect interfering signals $U_{in}$ of a disturbing field $\Delta B_S$. The field detector 31 belongs to an "NMR lock" and contains an NMR test sample in an RF resonator that transfers its output signal to an NMR receiver 32 and subsequently to two parallel control branches 36, 37. The first control branch 36 comprises a control amplifier 33. A control loop of this type has already been disclosed in prior art and is primarily responsible for the suppression of the slow field changes. A multi-selective filter system 35 is disposed in the second control branch 37, which is mainly provided for suppressing the periodic field disturbances. The signals of both control branches 36, 37 are added in an adding device 38 and supplied to a compensation coil 34. A correction field $\Delta B_K$ is generated at the output of the compensation coil 34 that compensates for the actual disturbance field $\Delta B_S$, such that only a small differential portion $\Delta B_D = \Delta B_S - \Delta B_K$ reaches the field detector 31 and thereby closes the entire control loop.

The central element of the inventive device is the MSF 35 which provides one selective filter element for each periodic disturbing component that is to be suppressed, wherein all filter elements are parallel to each other and are combined to form the separate control branch 37 within the entire field stabilizer. The individual filter elements transfer selective frequency ranges whose center frequencies are adjusted to the individual disturbing frequencies of $U_{in}$. This adjustment is performed either prior to start of the field stabilizer and remains unchanged during the entire control process, or it is performed continuously and automatically during the entire control process (adaptive method).

In order to better understand the benefit of the MSF 35, the control behavior of the conventional field stabilizer 33 will be explained at first.

The control bandwidth and thereby the quality of field stabilization of the field stabilizer 33 increases with increasing control amplification. This applies up to the point where the control loop starts to become unstable or where the noise portion in the control system increases such that the quality of the field stabilization decreases again. This point defines the useful control bandwidth.

Figure 2A:
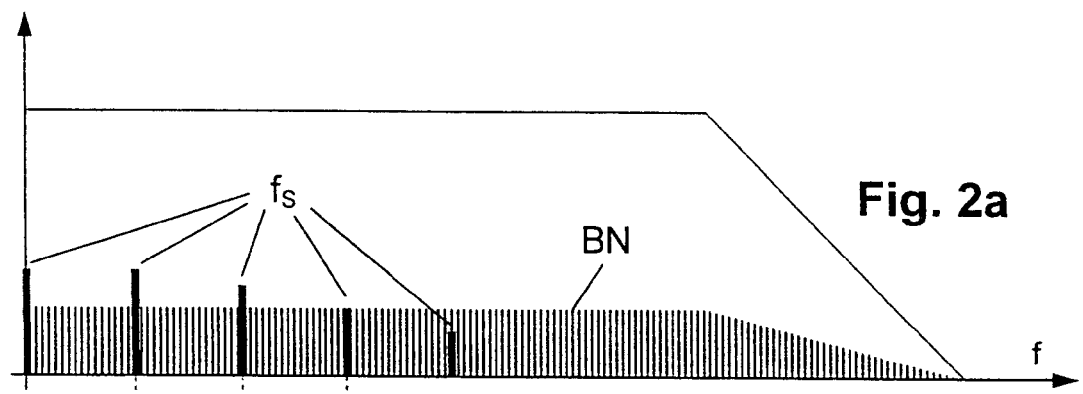
FIG. 2a shows disturbing components and a broadband noise of a field detector.

FIG. 2a shows an example for the signals that may show in the field stabilizer, at the output of the field detector 31. One can see a broadband noise BN and also different disturbing components $f_S$ which are to be suppressed. The disturbing component of the frequency f=0 (DC interfering signal) can suppress the slow field changes. One can also see four periodic interfering components of higher frequency which are to be regarded as the harmonics of a basic frequency in this example.

Figure 2B:
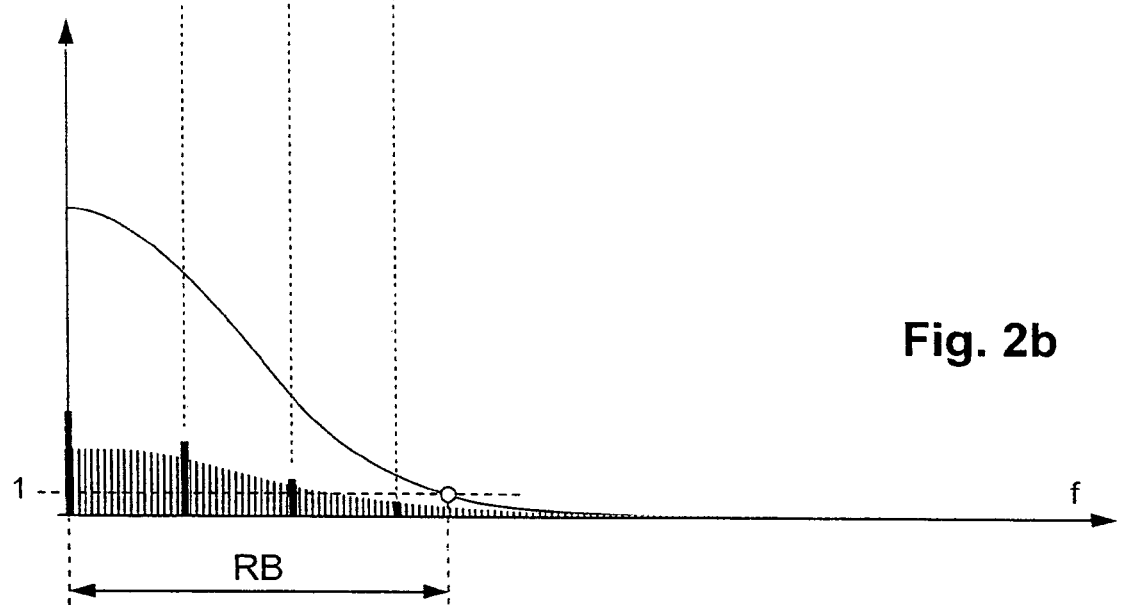
FIG. 2b shows disturbing components and the noise band at the output of a conventional control amplifier whose frequency response has low pass character.

FIG. 2b shows the disturbing components $f_S$ and the noise band at the output of the control amplifier 33 whose frequency response has a low pass character. The plotted function curve represents the amplitude response of the open control loop. The frequency at which this curve has an amplification of 1 (=0 dB) defines the control bandwidth RB. The DC signal at f=0 undergoes maximum control amplification and therefore maximum suppression. The periodic disturbing components $f_S$ which are within the control bandwidth are also suppressed. The closer they are to the high frequency end of the control bandwidth RB, the smaller is their suppression. Periodic disturbing components which are outside of the control bandwidth RB are only minimally suppressed.

Figure 4:
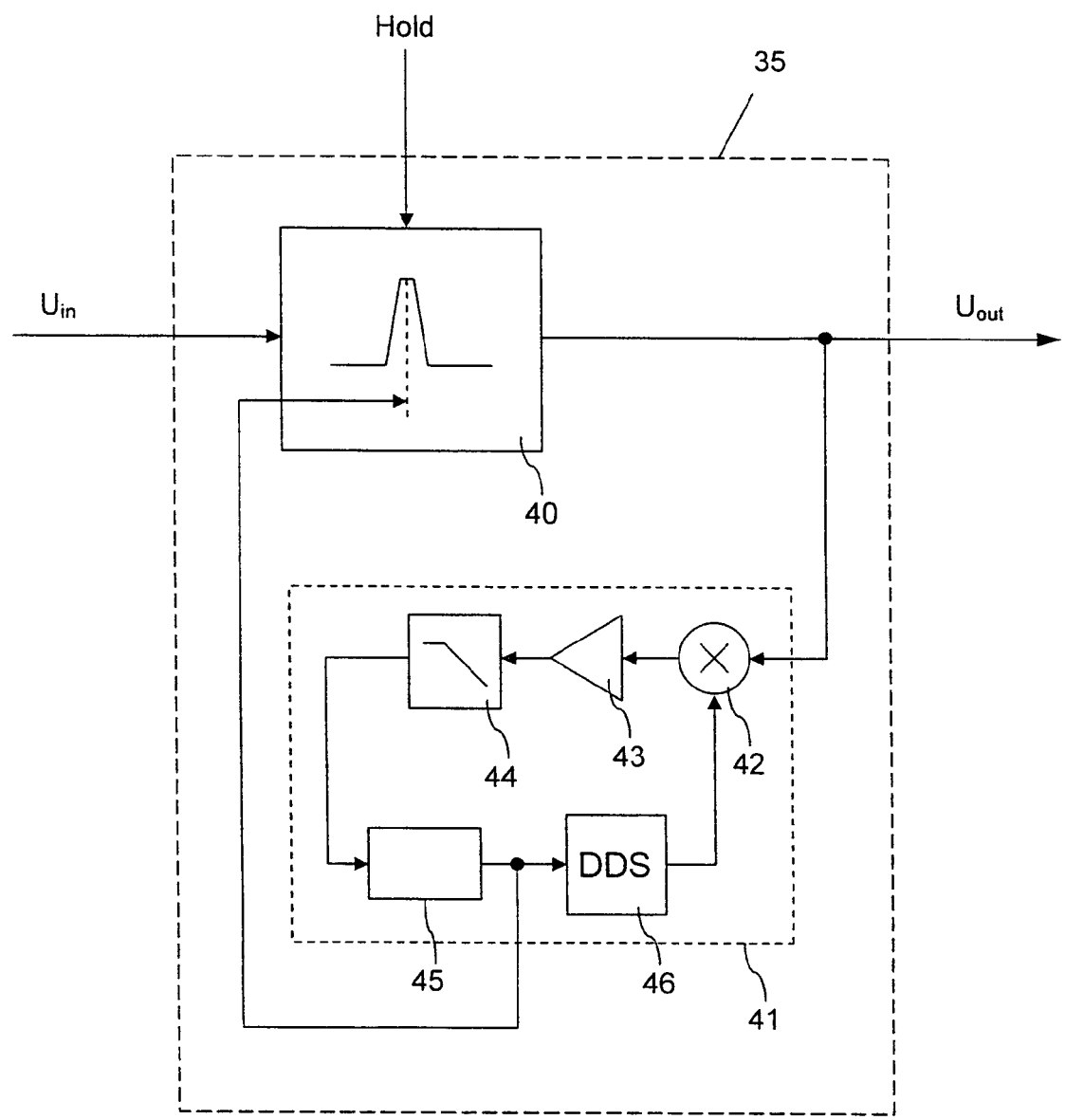
FIG. 4 shows an inventive embodiment of an MSF with a selective filter element in the form of a digital band pass filter.

The inventive device detects the individual periodic disturbing components $f_S$ with an improved SINO by using the MSF 35, such that the control amplification for these disturbing components $f_S$ can be increased. This leads to an increase of the useful control bandwidth and therefore also to an increased suppression of the disturbing components $f_S$. Regulation stabilization criteria must thereby be considered, but they are, however, not problematic, when the flanks of the selective areas of the MSF 35 are not too steep. This can be obtained e.g. in that a band filter 40 of second order is selected for the frequency selection within the MSF 35 (FIG. 4). The two flanks of the band filter 40 define the limits of the control bandwidth. If these are very steep, they produce strong phase shifts at the two limits and thereby large group delay times which can cause instabilities in the closed control loop. Good results can be obtained when the entire phase shift at the two limits of the control bandwidth does not exceed approximately +90° and −90°, respectively.

Figure 3A:
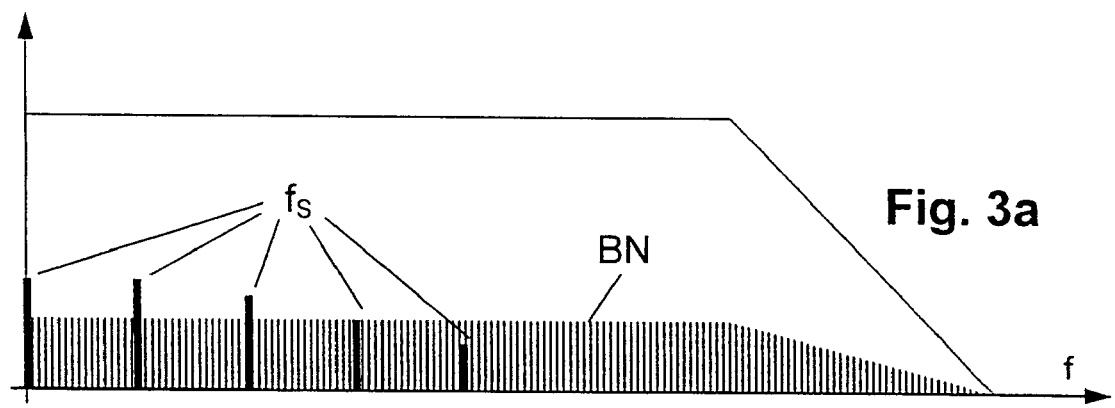
FIG. 3a shows disturbing components and a broadband noise of a field detector.
Figure 3B:
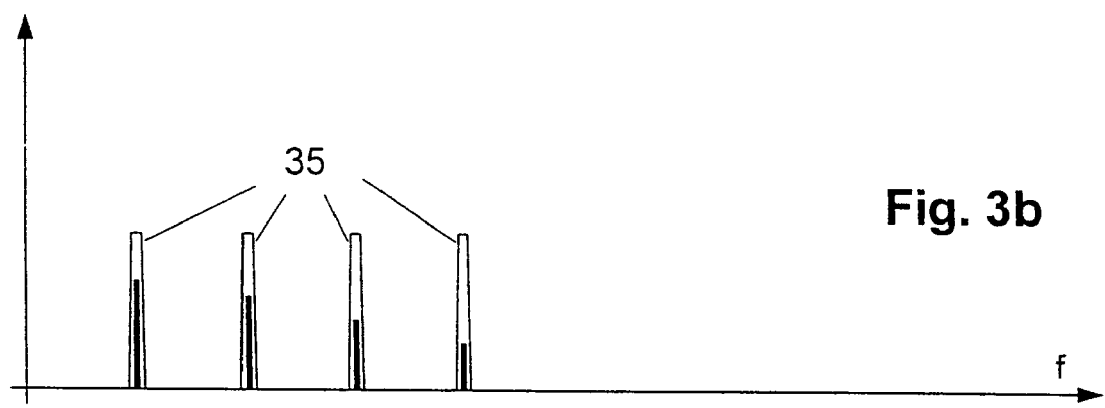
FIG. 3b shows periodic disturbing components which are filtered by selective filter elements.
Figure 3C:
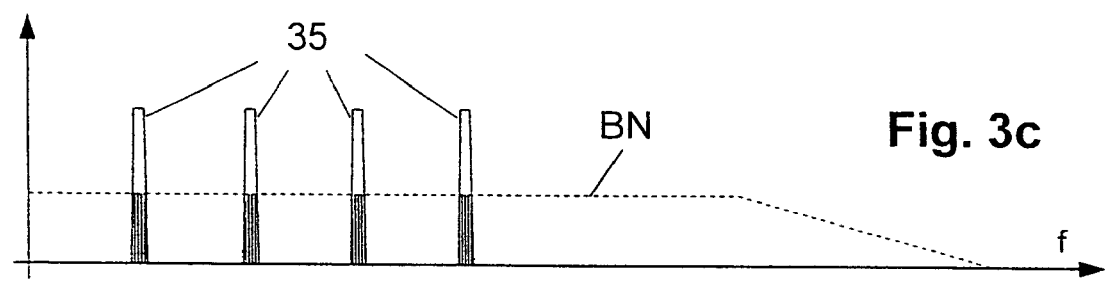
FIG. 3c shows the portion of the overall broadband noise that passes through the selective filter elements.

A band filter 40 of second order has the complex transfer function $U_{BP}(j\omega) = 1/(1 + j \cdot Q \cdot \Omega)$, wherein $j = \sqrt{-1}$
$Q \approx \omega_0 / B$
$\omega_0$ = center frequency of the band pass filter
$B = -3$ db bandwidth of the band pass filter
$\Omega = (\omega/\omega_0) - (\omega_0/\omega)$
$\Omega \approx 2 \cdot (\omega - \omega_0)/\omega_0$ when $(\omega - \omega_0)/\omega_0 \ll 1$
$\omega$ = frequency value on the frequency axis FIGS. 3a-c shows the advantages when using an MSF 35. FIG. 3a shows the signal from the field detector 31 which is composed of the individual disturbing frequency components $f_S$ and the broadband noise BN. The DC component at f=0 is responsible for the slow field changes. The other four frequency components $f_S$ represent the periodic interfering signals which are to be more strongly suppressed by the MSF 35. FIG. 3b shows how the individual periodic disturbing components pass through the MSF 35. FIG. 3c clearly shows that only a small part of the overall noise BN is allowed to pass through the MSF 35. The interfering signal at the output of the MSF 35 can therefore be detected with a high SINO and can therefore also be optimally suppressed with the inventive device.

When an NMR test sample is used as the field detector 31 in an RF resonator, which transfers its output signal to the NMR receiver 32 (NMR lock as shown in FIG. 1), one must consider that due to the properties of the magnetic spins in the NMR test sample, the field detector 31 corresponds to a selective "band pass filter" of high Q, with a bandwidth of e.g. only 0.1 Hz. The transfer properties of this "band pass filter" may have a strong influence on the stability of the control loop in that the flank regions of this "band pass filter" can cause a 90° shift of the field detector signal and have a strong influence on the control range of the control loop because they influence its upper frequency limit. Since the individual selective filter elements of the MSF 35 can also generate a phase shift of approximately 90° at this location, for proper regulation, the generated approximately 180° must be reduced to approximately 90° using a phase correction member which is installed in the control loop.

FIG. 4 shows a selective filter element within an MSF 35 which is realized as a digital band pass filter 40. The band pass filter 40 has a high quality factor and comprises a controller 41 which has a frequency generator 46 with adjustable frequency. The controller 41 adjusts the frequency of the frequency generator 46 to the frequency of the interfering signal $U_{in}$, i.e. the controller thus operates as a frequency meter, wherein the numerical value which defines the frequency of the frequency generator represents the measured value. This measured value can directly correct the center frequency of the band filter 40.

A phase locked loop (PLL) is particularly suited as a controller 41. It controls the frequency of a synthetic sine oscillation such that it has a rigid phase relation to the signal $U_{out}$. The frequency of the frequency generator 46 is controlled to the output frequency of the band pass filter 40 using the PLL, and the numerical frequency value of the frequency generator 46 is used to adjust the center frequency of the band pass filter 40. The output signal of the frequency generator 46 as well as the signal $U_{out}$, from the band pass filter 40 are thereby detected in a phase detector 42. The resulting detection signal is subsequently guided via an amplifier 43 and a low pass filter 44 and supplied to a register 45 whose numerical value defines, in turn, the frequency of the frequency generator 46.

The input "Hold" can start a holding process which is to render the band pass filter preferably insensitive to the input signal (interfering signal $U_{in}$). The holding process serves to maintain the operative state of the selective filter element during an advertently caused disturbance (e.g. change of the NMR sample) until the holding process is deactivated again.

This is achieved in that the quality factor (Q value) of the band pass filter is greatly increased during the holding process, such that the bandwidth becomes very small, and the build-up time as well as the decay time of the band filter 40 become very large. The required Q value depends on the duration of the desired holding process and is selected such that the build-up time as well as the decay time are much larger than the duration of the holding process. The band pass filter 40 therefore reacts very slowly to changes in the interfering signal $U_{in}$ and is operative much more quickly after termination of the holding process and after resetting the Q value to the original value, since practically no new and time consuming build-up process is necessary.

It may require complex calculations to realize band pass filters 40 of a very high Q, since multiplications with coefficients which are very close to 1 become necessary. This necessitates a very large mantissa even for floating point calculations. For this reason, an alternative embodiment in accordance with FIG. 5 may be very advantageous since it drastically reduces the calculation effort.

Figure 5:
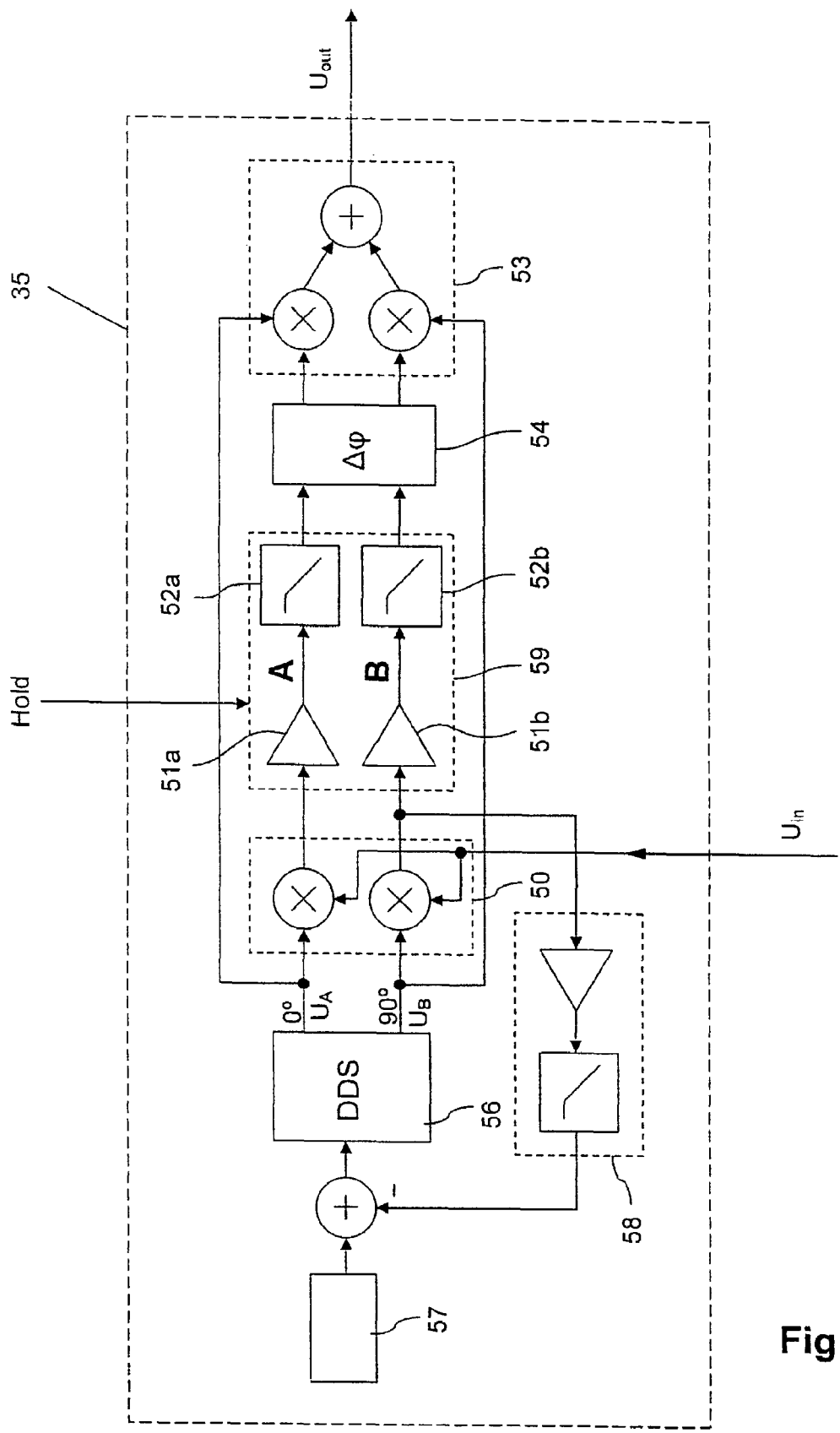
FIG. 5 shows a further inventive embodiment of an MSF with a selective filter element in the form of a quadrature detector.

The embodiment of FIG. 5 has a quadrature detector 50 into which the interfering signal $U_{in}$ and two reference signals $U_A$, $U_B$ generated by a reference generator 56 are fed in two signal channels A, B. The frequency of these reference signals $U_A$, $U_B$ is approximately equal to the frequency of the interfering signal $U_{in}$, is stored in the register 57, and is set once for identification of the interfering frequency. The phases of the reference signals are shifted by 90° relative to each other, such that the two interfering signals appearing in the two signal channels A, B at the output of the quadrature detector 50 and possessing a much lower frequency of around zero, are also phase shifted relative to each other by 90°. Thus the input signal $U_{in}$ is mixed down to very low frequencies. Each of the two interfering signals is guided to a transfer unit 59 where they are amplified in an amplifier 51*a*, 51*b* and filtered in a low pass filter 52*a*, 52*b*, whereby generating the desired frequency selectivity. The filtered signal is subsequently mixed in a quadrature modulator 53 back up to the original frequency. The basic idea of the embodiment of FIG. 5 consists in that the interfering signal $U_{in}$ is shifted to a low frequency range of around zero, the desired selectivity is produced at that location using a low pass filter 52*a*, 52*b* which can be easily calculated, and the filtered signal is subsequently mixed back up to the original frequency range. The generated interfering output signal $U_{out}$ then corresponds to a filtered interference signal $U_{in}$ which seems to be filtered in a selective band pass filter with twice the cut-off frequency of the low pass filter.

Since the interfering signals are very close to zero frequency and in quadrature to each other after passage through the quadrature detector 50, phase correction by a constant angle can be realized in a simple fashion by using a phase shifter 54 for both signal channels A, B and calculating for each output of the phase shifter 54 a linear combination of the two signals at the input of the phase shifter. Alternatively, the phase shifter may be also placed in the two reference channels where it can correct the two reference signals $U_A$, $U_B$ of the quadrature modulator and yield exactly the same effect. Phase correction improves the suppression of the disturbance with given amplification in that the phase error that the signals in the field detector 31, receiver 32 and compensation coil 34 undergo, is compensated for at the center frequency of the MSF 35.

In the embodiment of FIG. 5, the output of the quadrature detector 50 is connected to the reference generator 56 via a controller 58. The sum and difference frequency of the two inputs of the mixer (quadrature detector) are present at the output of the quadrature detector, wherein the difference frequency is the disturbing component which is shifted to the low frequency range around zero (=DC). For this reason, this signal can be used directly for frequency tracking. One of the two interfering signals transformed in the quadrature detector 50 is detected in one of the two signal channels A, B and supplied to the reference generator 56 via the controller 58. This permits adjustment of the frequency of the reference generator 56 to the frequency of the interfering signal (=adaptive process). The controller 58 comprises a low pass filter, in which the upper sideband of the interfering signal at the output of the quadrature detector and other disturbances are eliminated. The frequency or phase of the reference generator 56 is tracked such that the lower sideband is permanently zero. The amplitude in the respectively other signal channel appears thus with its maximum value which is equal to the full amplitude of the interfering signal $U_{in}$.

The frequency of the reference generator 56 may alternatively also be controlled by phase comparison with an external trigger signal which is synchronous to the disturbance source. This variant promises an improved performance for small variable disturbances.

In the embodiment of the inventive device shown in FIG. 5, the quality factor of the filter element can also be enlarged temporarily to an infinite value or at least to a very high value in the event of anticipated incoming disturbances of the field stabilizer (e.g. through gradient pulses, sample change, switching processes, time multiplex etc.). This means that the amplifications of the amplifiers 51*a*, 51*b* and the cut-off frequency of the low pass filter 52*a*, 52*b* become zero. The two low pass filters 52*a*, 52*b* perform as integrators with zero input thereby maintaining the former compensation of the disturbances and keeping the falsified measured signal away from the filters. When the disturbance is over, the former quality factor of the filters is activated again and further processing is immediately possible because the filters do not need a completely new build-up process.

If the ratio between the filter bandwidth and center frequency is not very large, the upper sideband at the output of the quadrature detector 50 which represents the first mixing stage in FIG. 5 is not sufficiently suppressed by the low pass filters 52*a*, 52*b*. In this case, a sample and hold device is inserted into the signal path upstream or downstream of phase correction, and is operated with the reference frequency of the reference generator 56, causing the upper undesired sideband to be folded exactly on the lower desired sideband where it no longer disturbs.

The inventive device and the inventive method permit selective detection of periodic field disturbances with high frequency components, while a major part of the existing noise is blocked out, thereby increasing the SINO.

LIST OF REFERENCE NUMERALS

A, B signal channel
$U_{in}$ interfering signal
$U_{out}$ interfering output signal
$U_A$, $U_B$ reference signal
BN broadband noise signal coming from the field detector (= Broadband Noise)

RB control bandwidth
$\Delta B_S$ interfering signal as field value
$\Delta B_K$ correction signal as field value
$\Delta B_D$ difference signal as field value ($\Delta B_D = \Delta B_S - \Delta B_K$)
Hold control signal for activating or deactivating the holding process
31 field detector
32 receiver
33 control amplifier for suppressing the slow field fluctuations
34 compensation coil for $B_0$
35 Multi-Selective Filter system (=MSF)
36 control branch with control amplifier
37 control branch with MSF
38 adding device
40 tuneable band pass filter of high quality
41 controller (frequency detector)
42 phase detector (mixer)
43 amplifier (PLL control amplifier)
44 low pass filter
45 holding register for holding the frequency value
46 frequency generator
50 quadrature detector (down converter)
51a/b amplifier with adjustable amplification
52a/b low pass filter (or integrator)
53 quadrature modulator (up converter)
54 phase shifter
56 reference generator with two outputs with quadrature relationship
57 holding register for the frequency
58 controller for tracking the frequency of the reference generator
59 transfer unit with low pass character which defines the frequency response of the selective filter element of the MSF

We claim:

1. A device for compensating field disruptions in magnetic fields of electromagnets with high field homogeneity for stabilizing an H0 field of an MR measuring system, the device comprising:
   at least one field detector for detecting interfering signals;
   at least one control loop for processing detected interfering signals;
   at least one compensation coil to which detected and processed interfering output signals are transferred to generate a correction field for compensating said interfering signals; and
   a selective filter system disposed in at least one of said control loops, said selective filter system comprising one or more selective filter elements which are connected in parallel, each selective filter element having a center frequency tuned to a frequency value of a respective interfering signal to be compensated for by that selective filter element, thereby strongly suppressing frequencies other than those of said interfering signals, wherein outputs of said filter elements are connected to at least one of said compensation coils, at least one of said field detectors being part of an NMR-lock, said lock having an additional regulation branch comprising said selective filter system, wherein tuning of said center frequencies of said filter system is effected once or in an adaptive manner.

2. The device of claim 1, wherein an adding device is disposed between outputs of said filter elements and said at least one compensation coil for adding interfering output signals of said filter elements.

3. The device of claim 1, wherein at least one of said selective filter elements is a band pass filter of second order with a complex transfer function $U_{BP}(j\omega)$, wherein $U_{BP}(j\omega)=1/(1+j\cdot Q\cdot\omega)$, with $j=\sqrt{-1}$
$Q\approx\omega_0/B$
$\omega_0$=center frequency of the band pass filter
$B$=−3 db bandwidth of the band pass filter
$\omega=(\omega/\omega_0)-(\omega_0/\omega)$
$\omega\approx 2\cdot(\omega-\omega_0)/\omega_0$ when $(\omega-\omega_0)/\omega_0<<1$
$\omega$=frequency value on the frequency axis.

4. The device of claim 3, wherein said selective filter element has a controller for controlling a center frequency of said band pass filter to a frequency of one of said interfering signals, wherein said controller comprises a frequency generator whose frequency can be adjusted, a phase detector for detecting an output signal of said frequency generator and said output signal from said band pass filter, an amplifier and a low pass filter that Is connected downstream of said amplifier, wherein a resulting detection signal from said phase detector is supplied via said amplifier and said low pass filter to a register whose numerical value defines a frequency of said frequency generator and represents an output value of said controller.

5. The device of claim 1, wherein at least one of said selective filter elements comprises a quadrature detector into which said interfering signal and two reference signals are fed via two signal channels, wherein a frequency of said reference signals is approximately equal to a frequency of said interfering signal, wherein phases of said reference signals are rotated relative to each other through 90°, and a transfer unit is guided to a quadrature modulator having an adding device in which interfering signals guided in said signal channels to the quadrature modulator via said transfer unit are added, wherein said reference signals in said quadrature modulator are identical to said reference signals in said quadrature detector.

6. The device of claim 5, wherein said transfer unit comprises one amplifier and one low pass filter for each signal channel.

7. The device of claim 5, wherein said low pass filter has a complex transfer function $U_{TP}(j\omega)$ with:

$U_{TP}(j\omega)=1/[1+j(\omega/\omega_C)]$, wherein $j=\sqrt{-1}$
$\omega$=frequency value on the frequency axis
$\omega_C$=cut-off frequency of the low pass filter.

8. The device of claim 5, wherein said transfer unit comprises one amplifier and one integrator for each signal channel.

9. The device of claim 5, wherein a controller is provided at an output of said quadrature detector via which one of two interfering signals transformed by said quadrature detector of one of said two signal channels can be detected and supplied to a reference generator, wherein said controller preferably comprises one amplifier and one low pass filter.

10. The device of claim 5, wherein a phase shifter is provided at an input of said quadrature modulator, which shifts two mutually orthogonal signals in said two signal channels by a defined angle $\Delta\phi$, such that said interfering output signal of said selective filter element is shifted, in addition to a phase shift of said transfer unit, by a constant angle $\Delta\phi$ relative to said interfering signal.

11. The device of claim 10, wherein a sample and hold device is connected upstream or downstream of said phase shifter and is operated synchronously with a reference generator.

12. The device of claim 1, wherein at least one of said selective filter elements has a control or hold input via which a quality factor of said selective filter element can be temporarily switched to very high values such that said filter element becomes insensitive to changes of input signal.

13. A method for compensating field disruptions in magnetic fields of electromagnets with high field homogeneity for stabilizing an H0 field of an MR measuring system, the method comprising the steps of:
   a) detecting interfering signals with a field detector;
   b) transferring the detected interfering signals to a compensation coil via a control branch; and
   c) generating a correction field for compensation of the field disruptions using said compensation coil, wherein the interfering signals are guided through selective filter elements, which are connected in parallel, of a selective filter system, each selective filter element having a center frequency tuned to a frequency value of a respective interfering signal to be compensated for by that selective filter element, thereby strongly suppressing frequencies other that those of said interfering signals, wherein the detection of the interfering signals and their transfer through the selective filter elements is effected by means of an NMR-lock comprising the selective filter system, with tuning of the center frequencies of that filter system being effected once or in an adaptive manner, and output signals of these filter elements are amplified individually or after addition, thereby meeting stabilization criteria of control loops, and are optionally phase-corrected.

14. The method of claim 13, wherein a center frequency of a selective filter element designed as a band pass filter is tracked by a controller such that the center frequency follows a frequency of the interfering signal, wherein an output signal of a frequency generator whose frequency can be adjusted, and the interfering output signal from the band pass filter are detected in a phase detector, with a resulting detection signal being subsequently guided via an amplifier and a low pass filter to a register whose numerical value defines a frequency of the frequency generator, wherein this numerical value is used to adjust the center frequency of the band pass filter to the frequency of the interfering signal.

15. The method of claim 13, wherein the interfering signal and two reference signals of a reference generator are fed into a quadrature detector within one filter element, wherein a frequency of these reference signals is approximately equal to a frequency of the interfering signal and their phases are rotated relative to each other through 90°, thereby generating one interfering signal in each of the signal channels at an output of the quadrature detector having a much lower frequency and being phase shifted by 90° relative to each other, wherein each of the two interfering signals is guided via an amplifier and a low pass filter, and supplied to a quadrature modulator whose reference signals are identical to those of the quadrature detector.

16. The method of claim 15, wherein one of two interfering signals is detected in said signal channels or is detected at an output of the quadrature detector and is supplied to a reference generator via a controller, wherein a frequency of the reference generator is preferably exactly adjusted to a frequency of the interfering signal in an adaptive process.

17. The method of claim 15, wherein two orthogonal signals in the signal channels are shifted by a defined angle $\Delta\phi$ at an input of the quadrature modulator using a phase shifter.

18. The method of claim 17, wherein a sample and hold device is connected upstream or downstream of the phase shifter and is operated synchronously to the reference generator.

19. The method of claim 13, wherein a quality factor of the selective filter elements is temporarily switched to very high values through a control or hold input thereby making the filter elements insensitive to changes in the input signal.

* * * * *